(12) United States Patent
Lee et al.

(10) Patent No.: US 7,145,828 B2
(45) Date of Patent: Dec. 5, 2006

(54) SEMICONDUCTOR MEMORY DEVICE WITH AUTO REFRESH TO SPECIFIED BANK

(75) Inventors: Yun-Sang Lee, Gyeonggi-do (KR); Jung-Bae Lee, Gyeonggi-do (KR)

(73) Assignee: Sasung Eelctronics Co., Ltd., Suwon-si (KR)

( * ) Notice: Subject to any disclaimer, the term of this patent is extended or adjusted under 35 U.S.C. 154(b) by 58 days.

(21) Appl. No.: 11/105,169

(22) Filed: Apr. 12, 2005

(65) Prior Publication Data
US 2005/0243627 A1  Nov. 3, 2005

(30) Foreign Application Priority Data
Apr. 29, 2004  (KR) ...................... 10-2004-0030213

(51) Int. Cl.
*G11C 7/00* (2006.01)
(52) U.S. Cl. .................. 365/222; 365/230.08; 365/233
(58) Field of Classification Search ........... 365/230.03, 365/222, 236, 233, 230.08, 189.05
See application file for complete search history.

(56) References Cited

U.S. PATENT DOCUMENTS

| | | | | |
|---|---|---|---|---|
| 5,418,754 A | * | 5/1995 | Sakakibara | ................. 365/222 |
| 5,627,791 A | | 5/1997 | Wright et al. | |
| 6,134,169 A | * | 10/2000 | Tanaka | ........................ 365/222 |
| 6,819,618 B1 | * | 11/2004 | Kashiwazaki | ................ 365/222 |
| 6,859,407 B1 | * | 2/2005 | Suh | .............. 365/222 |
| 7,079,440 B1 | * | 7/2006 | Remaklus et al. | ........... 365/222 |
| 2005/0108460 A1 | * | 5/2005 | David | ............................ 711/5 |
| 2006/0018174 A1 | * | 1/2006 | Park et al. | .................. 365/222 |
| 2006/0044912 A1 | * | 3/2006 | Kim et al. | .................. 365/222 |

\* cited by examiner

*Primary Examiner*—Richard Elms
*Assistant Examiner*—Hien N Nguyen
(74) *Attorney, Agent, or Firm*—Marger Johnson & McCollom, P.C.

(57) ABSTRACT

Method and apparatus for use with multi-bank Synchronous Dynamic Random Access Memory (SDRAM) circuits, modules, and memory systems are disclosed. In one described embodiment, an SDRAM circuit receives a bank address to be used in an auto-refresh operation, and performs the auto-refresh operation on the specified bank and for a current refresh row. When all bank addresses have been supplied for the current row, the SDRAM circuit updates the current refresh row and repeats the process. This process can allow a memory controller to modify an auto-refresh bank sequence as necessary such that auto-refresh operations can proceed on some memory banks concurrently with reads and writes to other memory banks, allowing better utilization of the SDRAM circuit. Other embodiments are described and claimed.

43 Claims, 21 Drawing Sheets

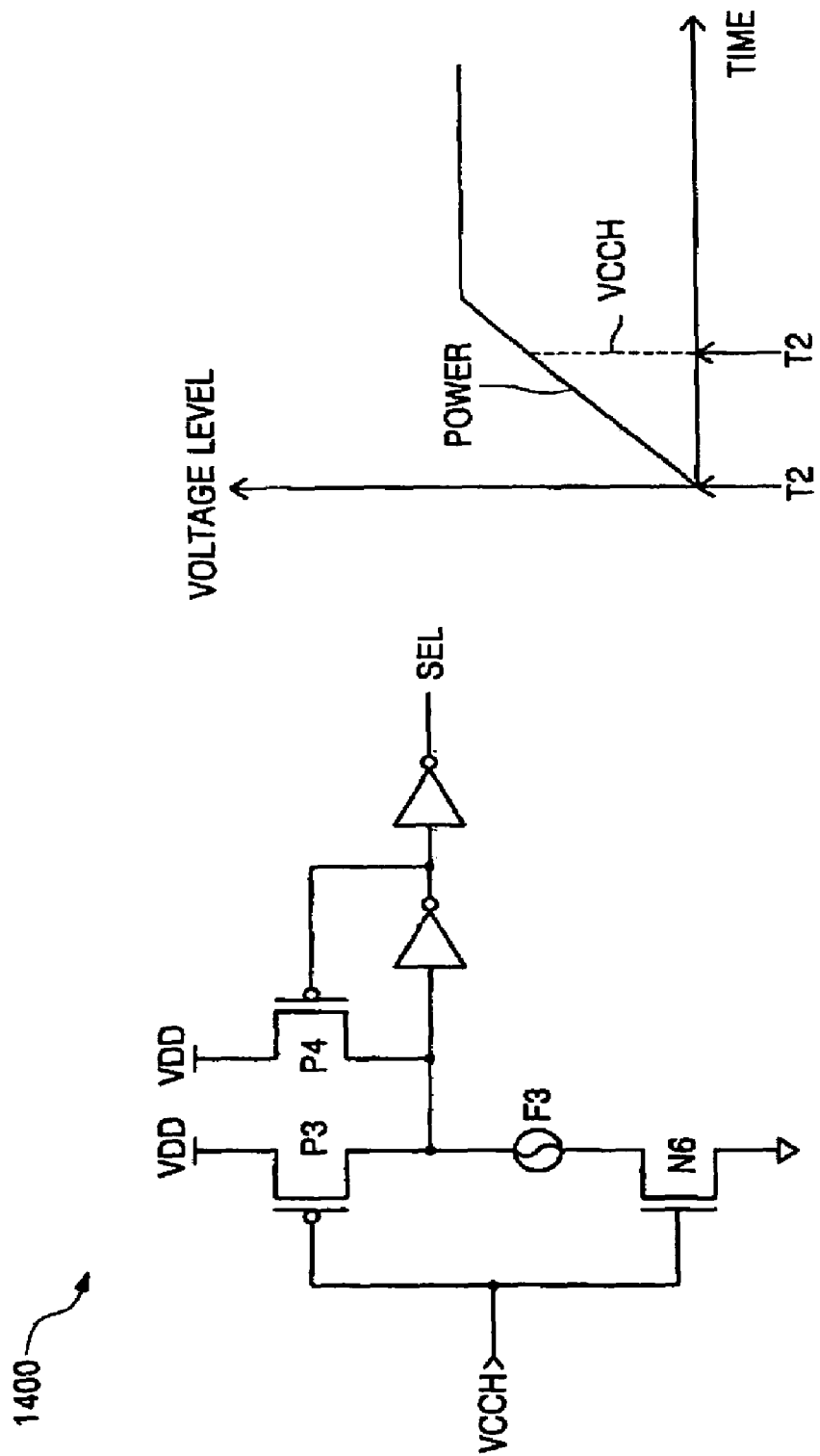

SEMICONDUCTOR MEMORY DEVICE WITH AUTO REFRESH TO SPECIFIED BANK

BACKGROUND OF THE INVENTION

RELATED APPLICATIONS

This application claims the benefit of priority to Korean Patent Application 2004-30213, filed Apr. 29, 2004, the disclosure of which is incorporated herein by reference.

1. Field of the Invention

The present invention relates to dynamic random access memory (DRAM) semiconductor devices and systems, and more particularly to methods and apparatus for per-bank auto-refresh operations to a specified memory bank of a multi-bank.

2. Description of the Related Art

DRAM devices are well known and commonly found in digital systems having a need for read/write digital memory. DRAM devices are so-named because the data in each memory cell must be refreshed periodically by reading the data, or else the stored data will be corrupted. Modern synchronous DRAM devices typically employ an "auto-refresh" mode, which refreshes one row of the DRAM memory cell array each time an auto-refresh operation is initiated by an external memory controller. An internal refresh row counter increments through the rows for successive auto-refresh operations, and wraps back to the top of the array upon reaching the bottom. The DRAM memory controller thus has some flexibility as to when it issues the auto-refresh commands to a DRAM device, as long as all rows are refreshed within the maximum time specified for the array to maintain stable data.

Many SDRAM devices contain multiple banks of memory, with the high-order row address bits supplied to the SDRAM along with an operation determining which bank is to receive the operation. U.S. Pat. No. 5,627,791, issued to Wright et al., describes such a device. Wright's device allows auto-refresh operations to be addressed to individual banks, using the high-order row address bits. Wright maintains a separate refresh row counter for each bank, and selects the appropriate refresh row counter for the bank that is the target of each refresh operation. Wright's memory controller is responsible for addressing each bank at the minimum rate required to maintain data stability.

SUMMARY OF THE INVENTION

The described embodiments add flexibility and increased capability as compared to prior art Per-Bank Refresh (PBR) SDRAM devices. A refresh address generator is shared by a plurality of memory banks. Bank address circuitry receives an externally supplied bank address for a refresh operation, and applies the refresh operation to the current refresh row of the memory cell array bank corresponding to the bank address. A refresh bank address counter determines when the refresh address generator should increment to a new refresh row by one of several techniques that are described below. This allows a memory controller to efficiently schedule auto-refresh operations on some banks while read/write operations are ongoing on a separate memory bank, and to change the auto-refresh sequence for different refresh rows.

BRIEF DESCRIPTION OF THE DRAWINGS

FIG. 14d illustrates a fuse circuit useful for programming a final bank address;

DETAILED DESCRIPTION OF THE EMBODIMENTS

Figure 1:
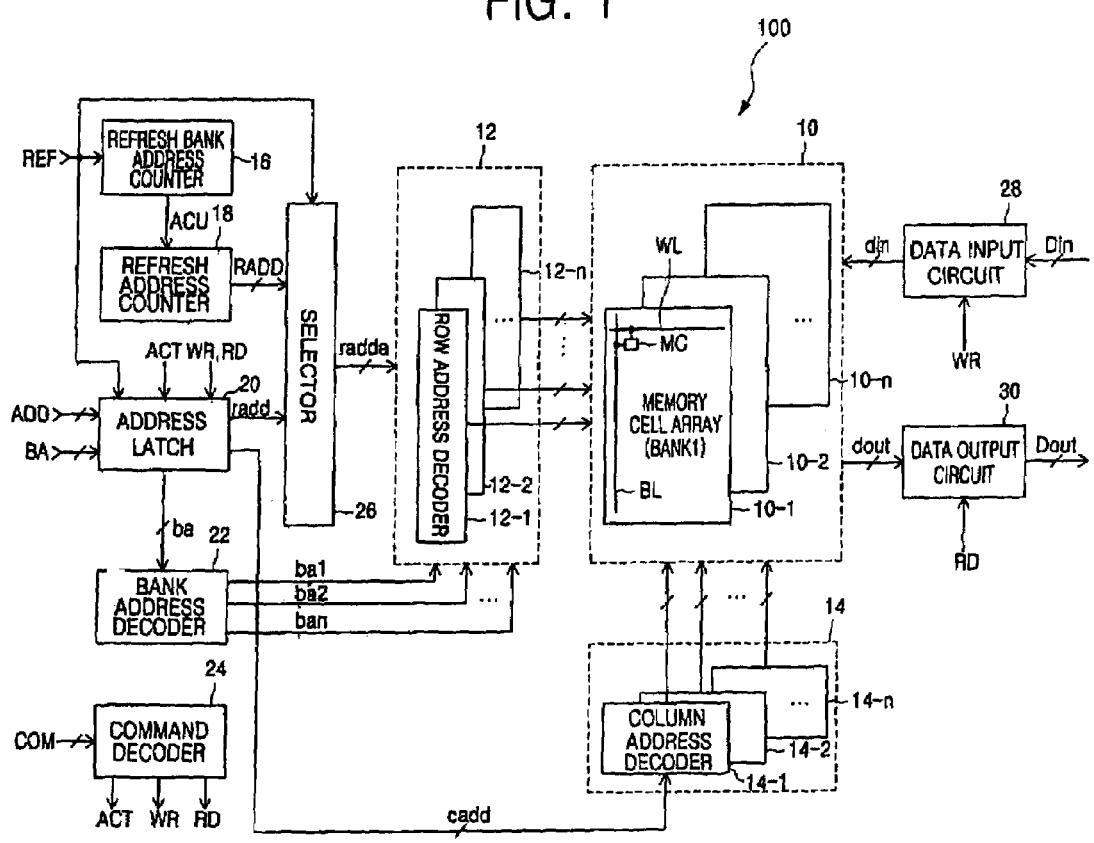
FIG. 1 illustrates, in block diagram form, a synchronous dynamic random access memory (SDRAM) device according to a first embodiment of the present invention.

FIG. 1 shows a SDRAM device 100 in block diagram form. A memory cell array 10 comprises a plurality of memory cell array banks 10-1 to 10-n, where n can be any number larger than 1, and is typically a power of 2. Each bank comprises a plurality of memory cells MC, each connected to a unique combination of one of a plurality of bit lines BL and one of a plurality of word lines WL, as is known in the art.

A row address decoder circuit 12 selects one of the word lines for each memory operation based on a supplied row address radda. Row address decoder circuit 12 comprises a plurality of row address decoders 12-1 to 12-n, each activating word lines in a respective one of the memory cell array banks 10-1 to 10-n. A plurality of bank select signals ba1 to ban determines which of the row address decoders responds to row address radda.

A column address decoder circuit 14 selects the bit line(s) that will be read/written during memory read/write operations, based on a column address cadd. Column address decoder circuit 14 comprises a plurality of column address decoders 14-1 to 14-n, each reading bit lines in a respective one of the memory cell array banks 10-1 to 10-n.

A refresh bank address counter 16 receives an externally supplied auto-refresh command signal REF, and activates an Address Count Update (ACU) signal to a refresh address counter 18 when a new refresh row address should be generated. Refresh address counter supplies a current refresh row address RADD to a selector 26. That is, when the memory 100 is composed of eight banks, the refresh bank address counter 16 activates the address count update (ACU) signal after the refresh bank address counter 16 receives the external auto-refresh command signal (REF) eight times, once for each memory banks. After the ACU signal is enabled, the current refresh row address RADD is updated to a next refresh row address RADD corresponding to a memory cell refresh row to be refreshed during the next refresh cycle time. This process is continuously repeated during refresh operations.

An address latch 20 receives a plurality of external address signals ADD and a plurality of external bank address signals BA. The external auto-refresh command signal REF, an Active command (ACT) signal, Write command (WR) signal, and Read command (RD) signal determine how ADD and BA are interpreted. During an active command, the ADD signals are latched and supplied as a row address radd to selector 26 for activating a word line corresponding to the row address radd of a selected memory bank, and the BA signals are latched and supplied to a bank address decoder 22 as a bank address ba of the selected memory bank. During a read or write command, the ADD signals (and possibly the BA signals as well) are latched and supplied as column address cadd to the column address decoder circuit 14. During an auto-refresh command, the bank address signals BA are latched and supplied as bank address ba to the bank address decoder 22.

The bank address decoder 22 decodes bank address ba to generate the appropriate bank select signal from the group ba1–ban.

A command decoder 24 receives external command signals COM and generates various control signals, including ACT, WR, and RD.

Selector 26 determines whether the current refresh row address RADD or the address latch output address radd is passed to row address decoder circuit 12 as row address radda. The auto-refresh command signal REF is supplied to selector 26 as the selection signal—when REF is asserted, RADD is selected, and otherwise radd is selected.

A data input circuit 28 reads write data signals Din from an external data bus when Write command signal WR is active, and supplies the write data signals din to a selected memory cell array bank responsive to the bank address BA. A data output circuit 30 receives read data signals dout from the selected memory cell array bank in response to the bank address BA when Read command signal RD is active, and supplies the read data signals Dout to the external data bus. The following figures will further illustrate operation of SDRAM device 100.

Figure 2:
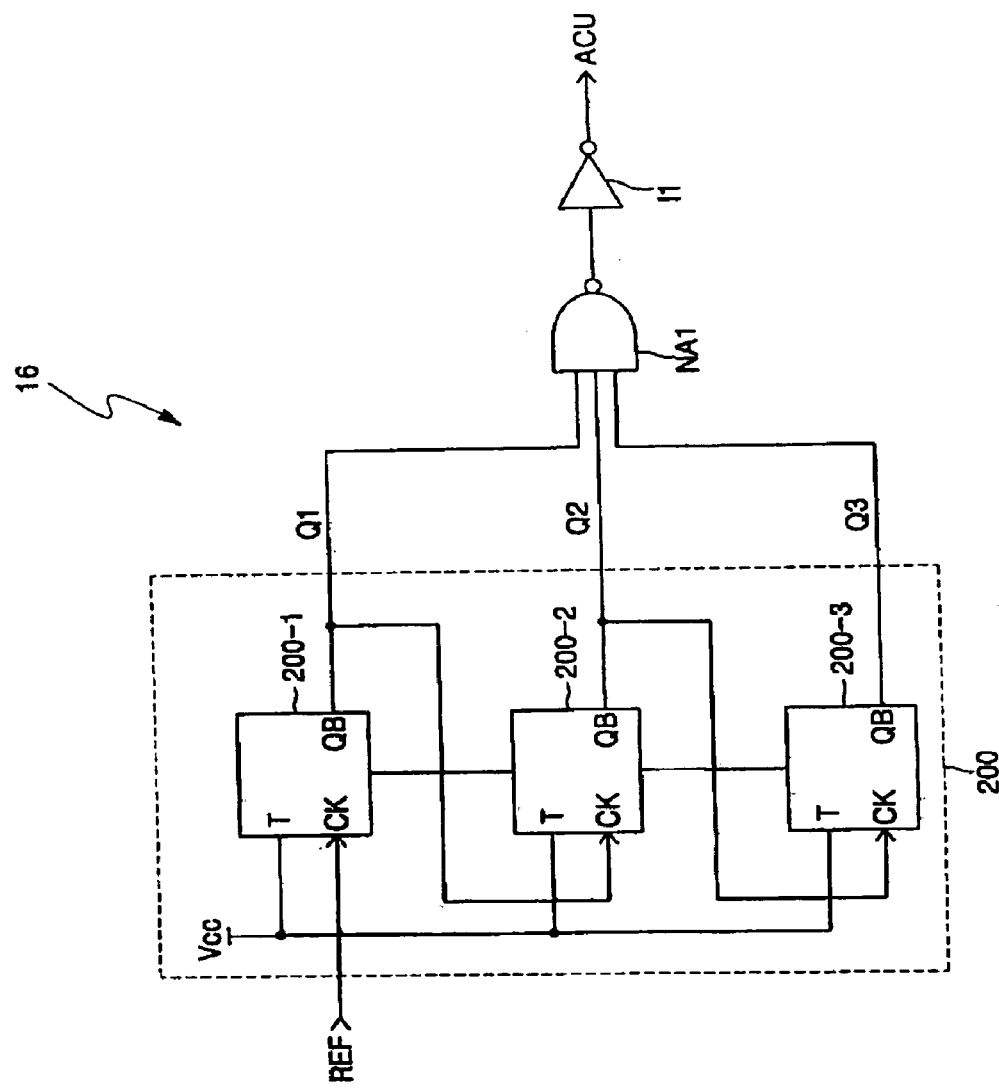
FIG. 2 illustrates a refresh bank address counter useful, e.g., in the SDRAM device of FIG. 1.

FIG. 2 shows an embodiment of refresh bank address counter 16, specifically for a case where n=8. A count circuit 200 contains three T (toggle) flip flops 200-1, 200-2, and 200-3, each with an input T tied to logic high, an output QB, and a clock input CK. For flip flop 200-1, clock input CK is tied to REF, such that flip flop 200-1 toggles QB on successive auto-refresh commands. Flip flop 200-1 output QB is tied to flip flop 200-2 clock input CK, such that flip flop 200-2 toggles every other time an auto-refresh command is received. Flip flop 200-2 output QB is tied to flip flop 200-3 clock input CK, such that flip flop 200-3 toggles every fourth time that an auto-refresh command is received.

The outputs of flip flops 200-1, 200-2, and 200-3 are supplied as inputs Q1, Q2, and Q3 to a three-input NAND gate NA1. NAND gate NA1 supplies its output to an inverter I1, which supplies its output in turn as the refresh bank address counter ACU signal.

In operation, count circuit 200 produces, on eight consecutive auto-refresh cycles, an output Q1Q2Q3 of 000, 001, 010, 011, 100, 101, 110, 111, and then repeats. For example, assuming that counter circuit 200 output data Q1Q2Q3 is 000 after the refresh command signal REF is enabled, then when output data Q1Q2Q3 equals 111, ACU is activated, signaling refresh address counter 18 to advance the current refresh row. In another example, assuming that the output data Q1Q2Q3 of the counter circuit 200 is '101' after REF is enabled, ACU is activated when output data Q1Q2Q3 becomes '100'.

Figure 3:
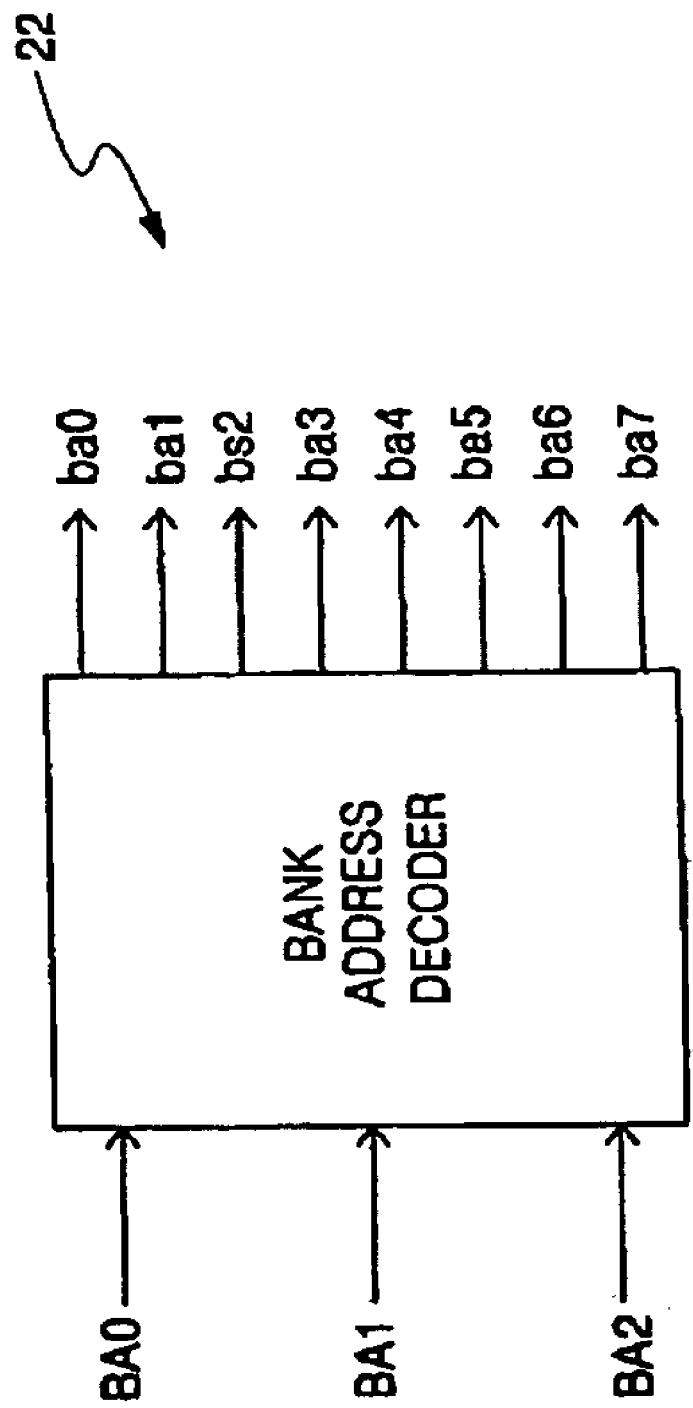
FIG. 3 contains a block diagram for a bank address decoder useful, e.g., in the SDRAM device of FIG. 1.

FIG. 3 shows the bank address decoder 22 for the eight-bank case of FIG. 2. Three bank address signals BA0 to BA2 are decoded to select one of eight bank select signals ba0–ba7.

Figure 4:
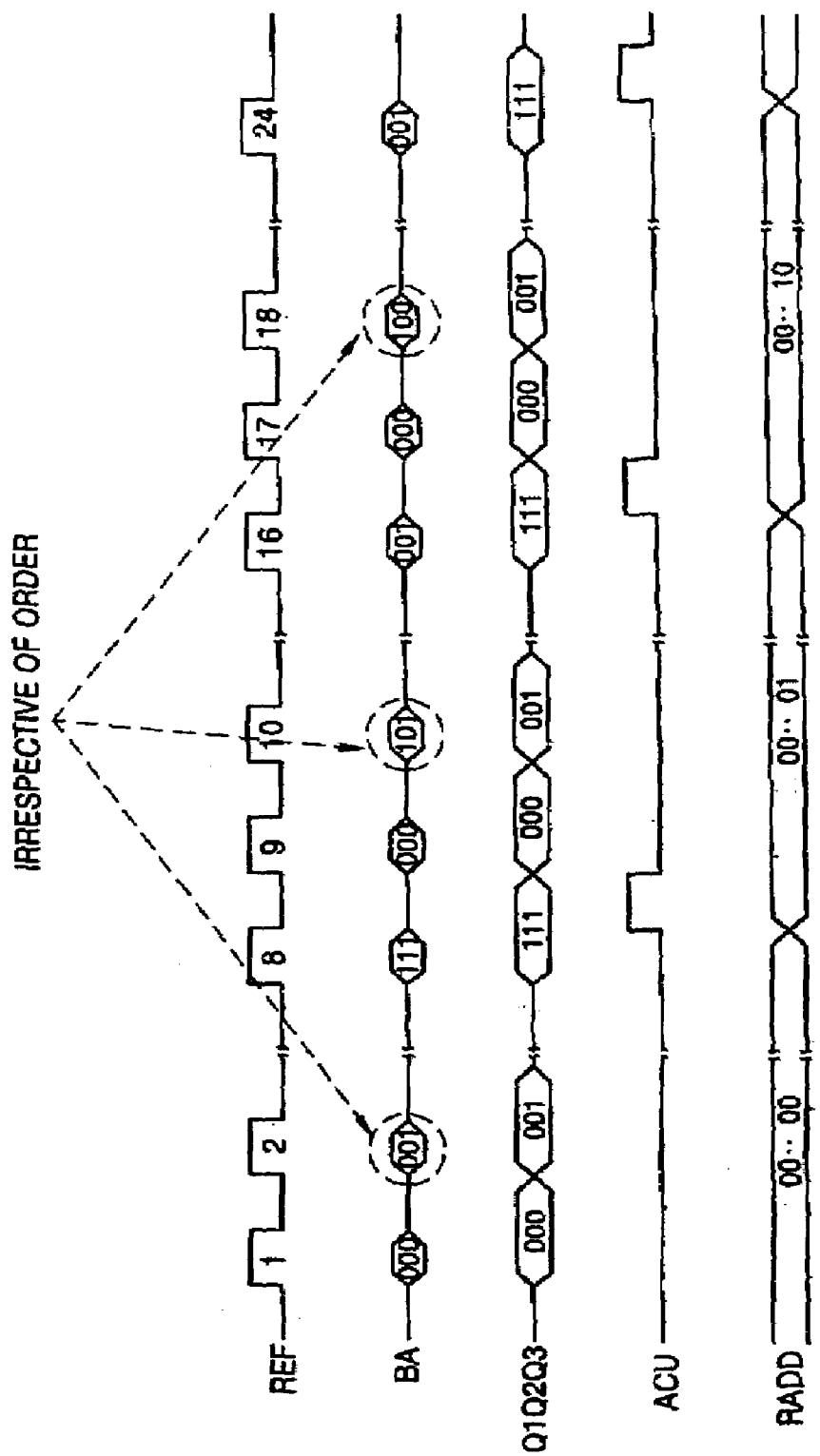
FIG. 4 depicts a timing diagram for operation of the SDRAM device of FIG. 1.

FIG. 4 shows a timing diagram for the circuit of FIGS. 1, 2, and 3. In a first auto-refresh cycle 1 of FIG. 4, an external controller asserts REF and supplies a bank address BA=000. Count circuit 200 has an output Q1Q2Q3=000, and the refresh row address RADD has least significant bits 00. On the next seven auto-refresh cycles, the memory controller supplies different bank addresses (other than 000) to refresh row address 00.00 in each of the eight banks. On refresh cycle 8, Q1Q2Q3 has counted up to 111, causing ACU to transition to logic high on the next clock edge. ACU transitioning high causes refresh address counter 18 (FIG. 1) to increment RADD, such that the least significant bits are now 01.

On refresh cycle 9, a bank address of 000 is supplied for the new refresh row 00.01. For cycles 9–16, however, the bank refresh order varies from that of cycles 1–8. This does not change the operation of refresh bank address counter 16, which signals refresh address counter 18 to advance the refresh row after eight refresh operations have been addressed to the current refresh row.

Figure 5:
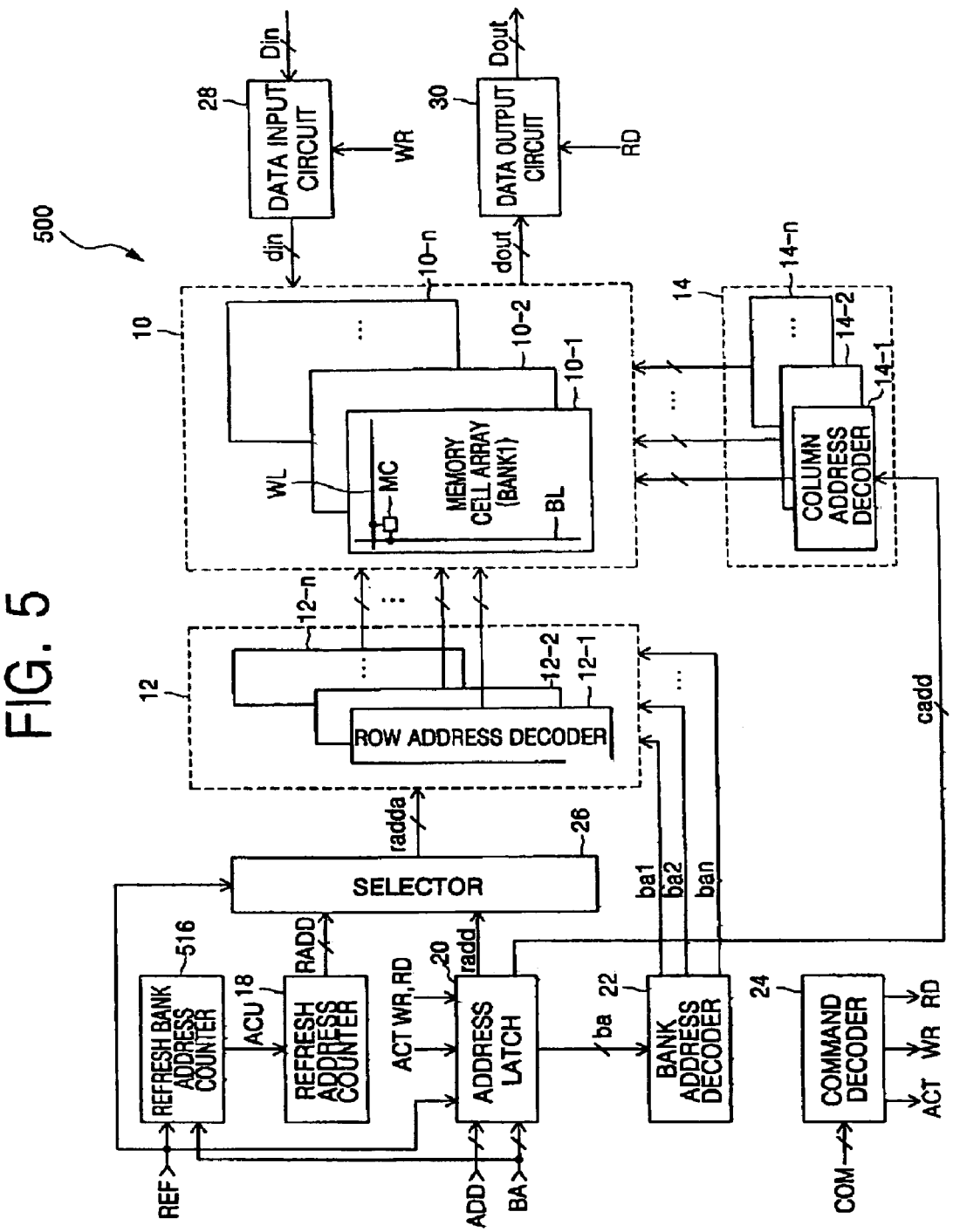
FIG. 5 contains a block diagram for an SDRAM device according to a second embodiment of the present invention.

FIG. 5 illustrates a second embodiment of the present invention, wherein a refresh bank address counter 516 is substituted for refresh bank address counter 16. Refresh bank address counter 516 receives, in addition to auto-refresh command signal REF, the external bank address BA. This allows refresh bank address counter 516 to ensure that all banks have been addressed in an auto-refresh operation—even if one is duplicated and more than eight refresh operations are required—before the refresh address counter is advanced.

Figure 6:
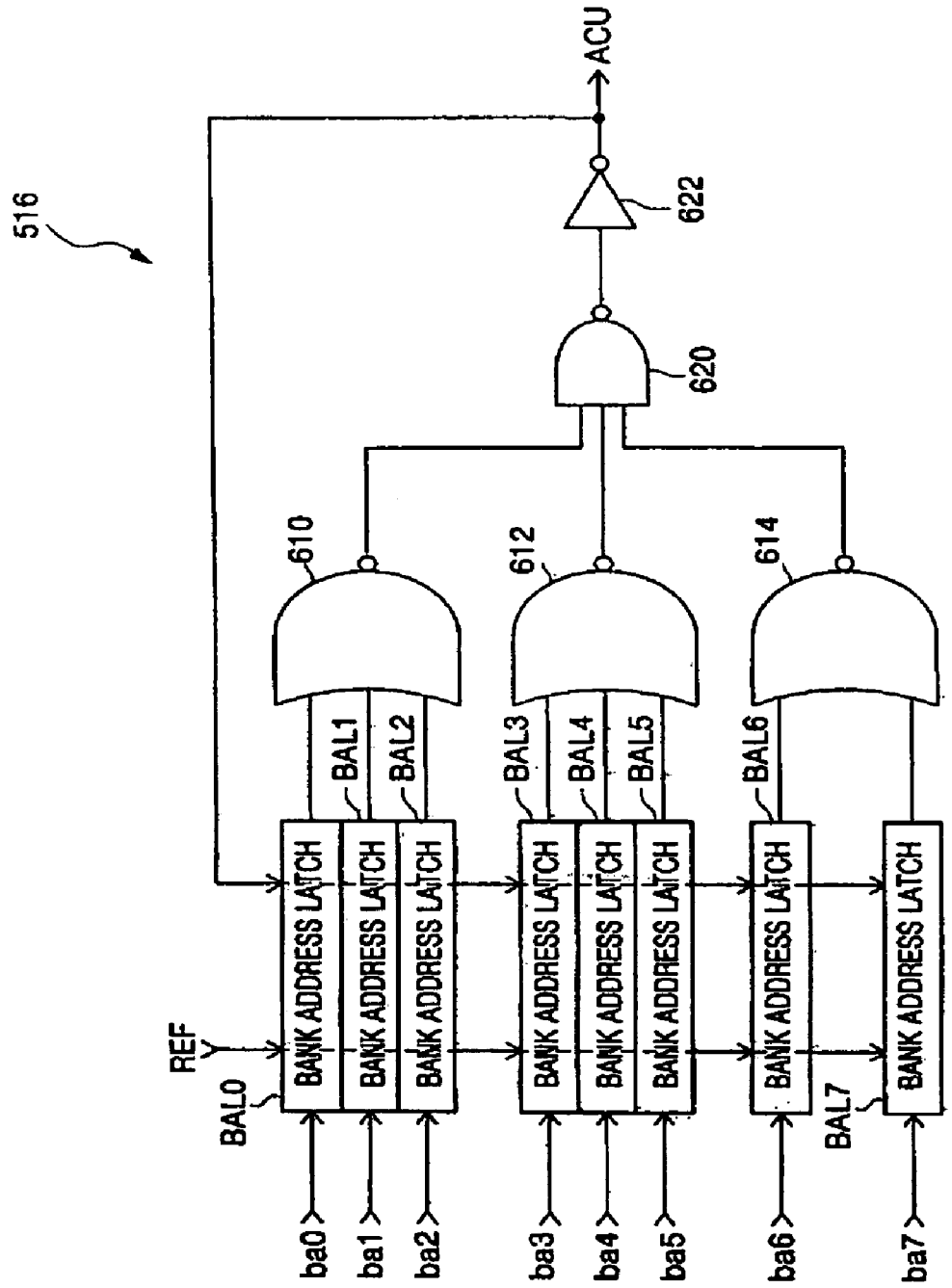
FIG. 6 illustrates a refresh bank address counter useful, e.g., in the SDRAM device of FIG. 5.

FIG. 6 shows further detail for one embodiment of refresh bank address counter 516. A plurality of bank addresses latches, BAL0–BAL7, are configured to register when respective decoded bank addresses ba0–ba7 are addressed in an auto-refresh operation. A first NOR gate 610 NORs the outputs of bank address latches BAL0, BAL1, and BAL2. A second NOR gate 612 NORs the outputs of bank address latches BAL3, BAL4, and BAL5. A third NOR gate 614 NORs the outputs of bank address latches BAL6 and BAL7.

The outputs of NOR gates 610, 612, and 614 are supplied as inputs to a NAND gate 620. The output of NAND gate 620 is supplied through an inverter 622 as the address count update signal ACU to refresh address counter 18.

In operation, each bank address latch BAL0–BAL7 outputs a logic high value until a refresh operation is directed to the corresponding memory bank. Each of NOR gates 610, 612, and 614 will generate a logic low output until each bank address latch BALn feeding that NOR gate registers a refresh operation directed to its corresponding memory bank. NAND gate 620/inverter 622 will therefore hold ACU low until each NOR gate has received an indication that all bank address latches generating inputs to that NOR gate have registered an auto-refresh operation with a corresponding bank address. In other words, the ACU signal is activated after all banks are enabled for a refresh operation with regard to the identical refresh row address.

Figure 7:
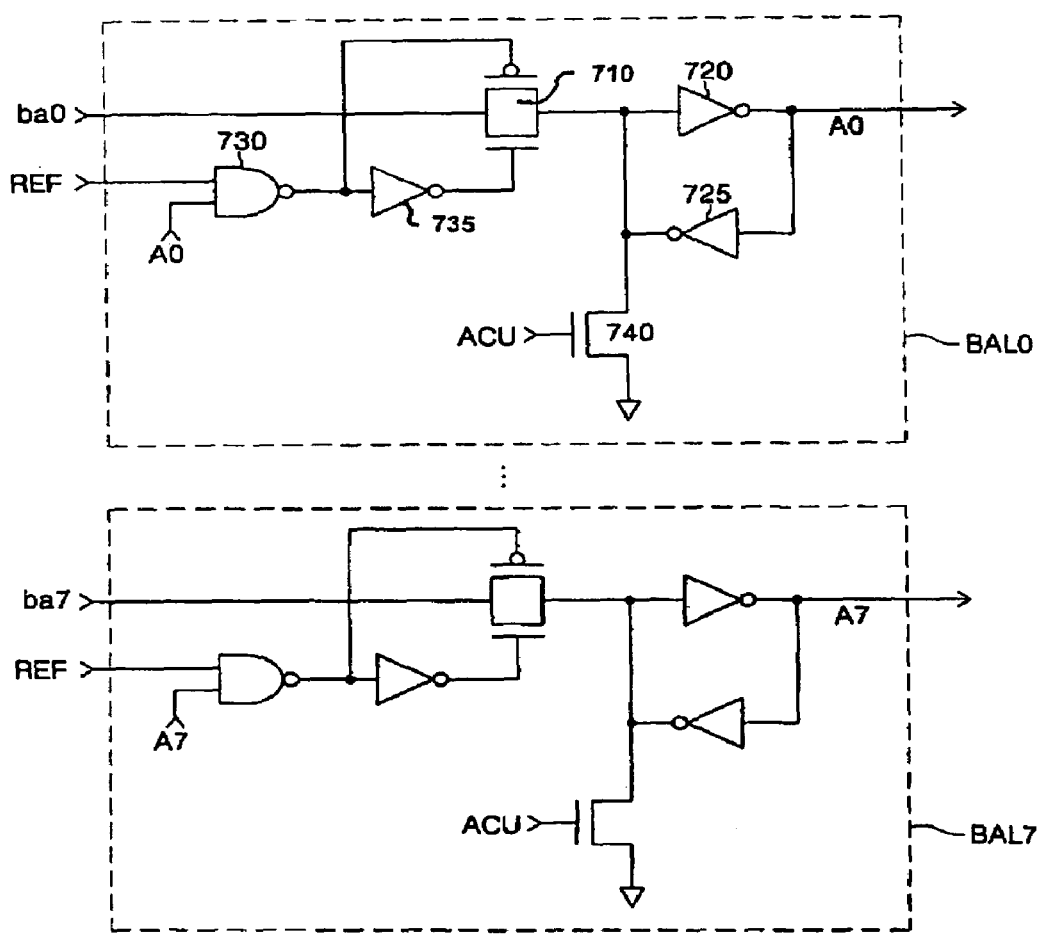
FIG. 7 shows one circuit for a bank address latch as used in FIG. 6.

FIG. 7 shows additional details for one bank address latch 516 embodiment, and specifically for BAL0 and BAL7. With respect to BAL0, a transmission gate 710 receives ba0 as an input and supplies an output to a latch comprising two inverters 720 and 725. The output of inverter 720 supplies a latch output A0 and an input to inverter 725. Inverter 725 connects back to the input of inverter 720 to hold a latch value.

Latch output 730 is supplies as one input to a NAND gate 730. The other input of NAND gate 730 receives the auto-refresh command signal REF. The output of NAND gate 730 directly drives a low-enabled transmission input of transmission gate 710, and drives a high-enabled transmission input of transmission gate 710 through an inverter 735. Finally, the ACU signal drives a transistor 740 connected between the latch input and ground.

In operation, when ACU is asserted, transistor 740 is turned on and pulls the input of latch 720 low, which drives latch output A0 high. With latch output A0 high, NAND gate 730 can respond to a high input at auto-refresh signal REF. When both A0 and REF are high, NAND gate 730 generates a low output, which energizes transmission gate 710. When transmission gate 710 is energized, it passes ba0 through to the input of latch transistor 720. In such a circumstance, the latch will switch state and output A0 low when ba0 is high, indicating that an auto-refresh operation was requested for bank 0. Once this event is latched and A0 is low, NAND gate 730 will not respond to additional auto-refresh cycles until ACU resets the latch after all banks have been addressed.

Figure 8:
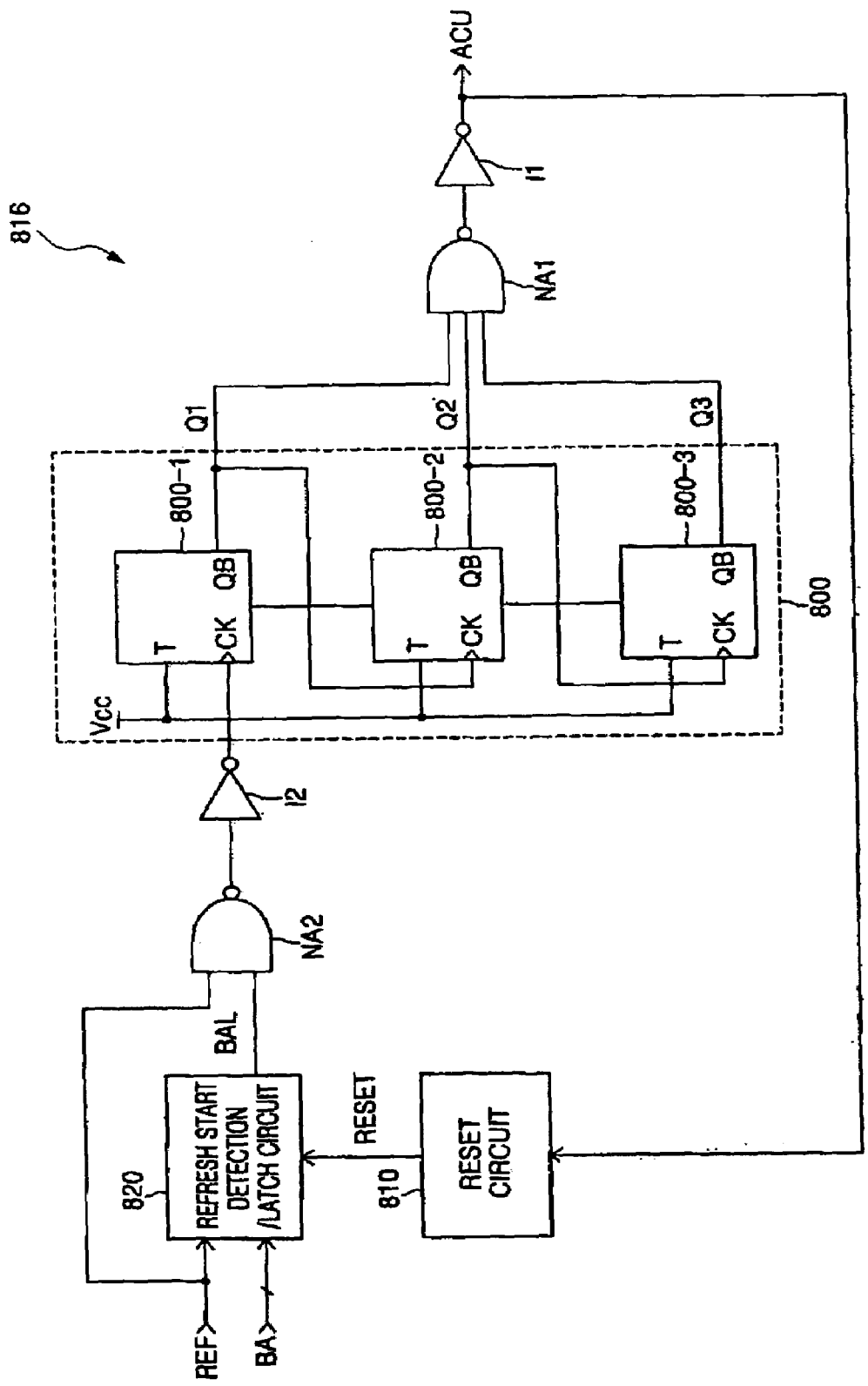
FIG. 8 depicts another refresh bank address counter useful with embodiments of the present invention.

FIG. 8 illustrates a refresh bank address counter embodiment 816 that can be substituted for refresh bank address counter 516 in some embodiments. Whereas refresh bank address counter 516 counts each refreshed bank in the order latched, refresh bank address counter 816 operates differently. Refresh bank address counter 816 does not begin counting refresh cycles until a predetermined start bank address is received along with an auto-refresh command, after which it counts eight refresh cycles, resets, and then waits for another auto-refresh command issued with the start bank address. For instance, in one embodiment bank 0 is designated as the start bank. Once a memory controller asserts bank 0 during an auto-refresh, it may then address the remaining seven banks in any order, and then the auto-refresh row advances and the device waits for another auto-refresh directed at bank 0 to begin counting again. One advantage of this embodiment is the memory controller can control when refresh operations begin on each row by when it asserts REF along with bank address 0.

In FIG. 8, refresh bank address counter 816 comprises a count circuit 800, a reset circuit 810, a refresh start detection/latch circuit 820, two NAND gates NA1 and NA2, and two inverters I1 and I2. Refresh start detection/latch circuit 820 receives the external bank address BA and external auto-refresh command signal REF. When the predetermined start bank address is received on BA along with an auto-refresh command on REF, circuit 820 asserts its output BAL.

BAL and REF are input to NA2, such that once BAL is asserted, the output of NA2 responds to REF. Inverter I2 inverts the output of NA2 and supplies the inverted signal to count circuit 800.

Count circuit 800 contains three T (toggle) flip flops 800-1, 800-2, and 800-3, each with an input T tied to logic high, an output QB, and a clock input CK. For flip flop 800-1, clock input CK is tied to the output of I2, such that flip flop 800-1 toggles QB on successive auto-refresh commands once an auto-refresh command with the start bank address is received. Flip flop 800-1 output QB is tied to flip flop 800-2 clock input CK, such that flip flop 800-2 toggles every other time an auto-refresh command is received after BAL is asserted. Flip flop 800-2 output QB is tied to flip flop 800-3 clock input CK, such that flip flop 800-3 toggles every fourth time that an auto-refresh command is received after BAL is asserted.

The outputs of flip flops 800-1, 800-2, and 800-3 are supplied as inputs Q1, Q2, and Q3 to three-input NAND gate NA1. NAND gate NA1 supplies its output to inverter I1, which supplies its output in turn as the refresh bank address counter ACU signal.

ACU is supplied to reset circuit 810, which resets refresh start detection/latch circuit 820 when ACU is asserted. Once reset, start detection/latch circuit 820 waits for an auto-refresh command for the start bank address to start the count for the next refresh row.

Figure 9A:
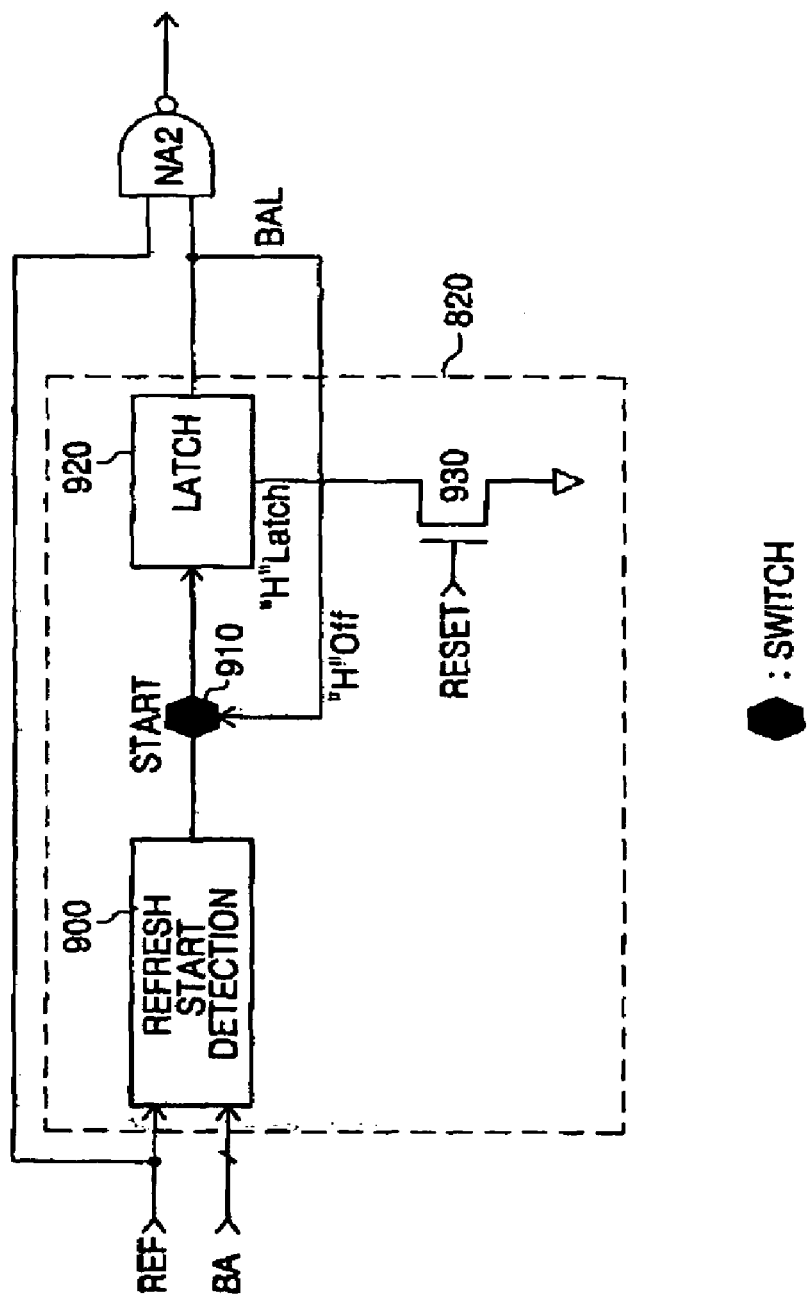
FIG. 9A illustrates the internal organization for the refresh start detection/latch circuit shown in FIG. 8.

FIG. 9A shows internal circuit details for refresh start detection/latch circuit 820, including a refresh start detection circuit 900, a switch 910, a latch 920, and a transistor 930. Refresh start detection circuit 900 receives REF and BA, and asserts a START signal when BA matches the start bank address. Switch 910 receives the START signal and passes it to the input of latch 920 when switch 910 is activated. When START is passed to latch 920, latch 920 is latched high, asserting output BAL from circuit 820. BAL is also fed back to switch 910, deactivating switch 910.

When RESET is asserted from reset circuit 810 (FIG. 8), transistor 930 is activated, pulling latch 920 low. When latch 920 is pulled low, BAL is deasserted and switch 910 is reactivated to prepare the circuit for the next auto-refresh command to the start address.

Figure 9B:
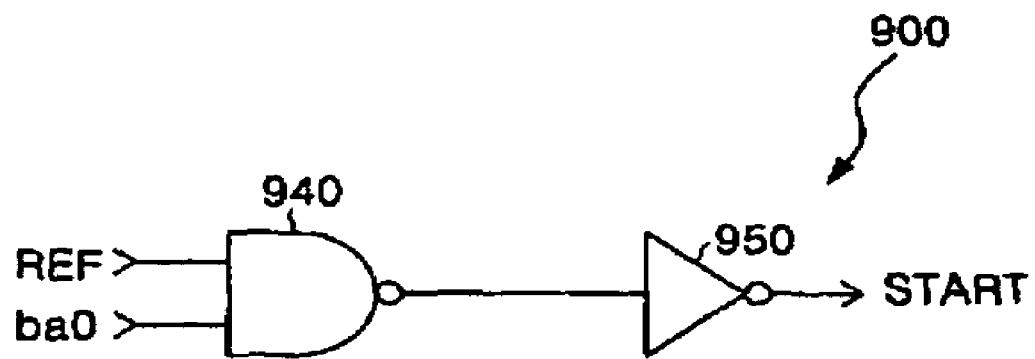
FIGS. 9B and 9C show two possible refresh start detection circuits useful in the refresh start detection/latch circuit of FIG. 9A.
Figure 9C:
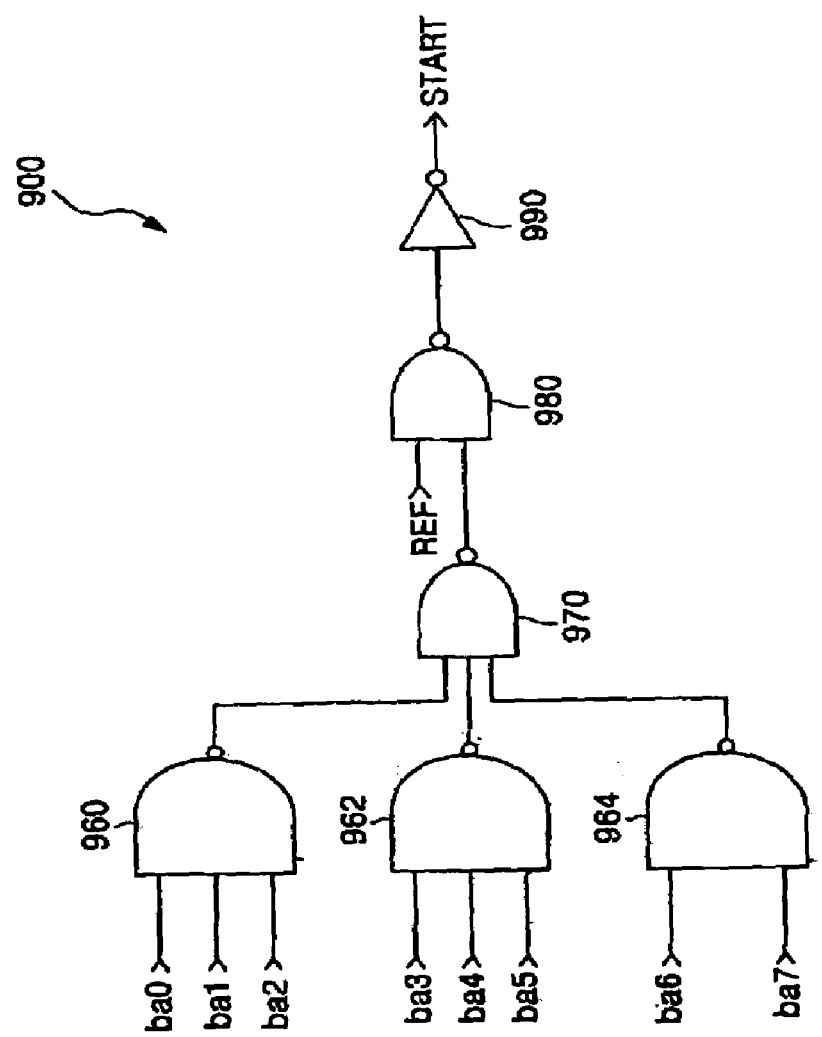

FIGS. 9B and 9C show two possible refresh start detection circuits 900. In FIG. 9B, circuit 900 comprises a NAND gate 940 paired with an inverter 950 to implement an AND function. REF and one decoded bank address (in this case ba0, but any other bank address could also be chosen) are supplied as inputs to the NAND gate. When REF and ba0 are high, the output of inverter 950 is also driven high, and is supplied as the START signal.

Figure 10:
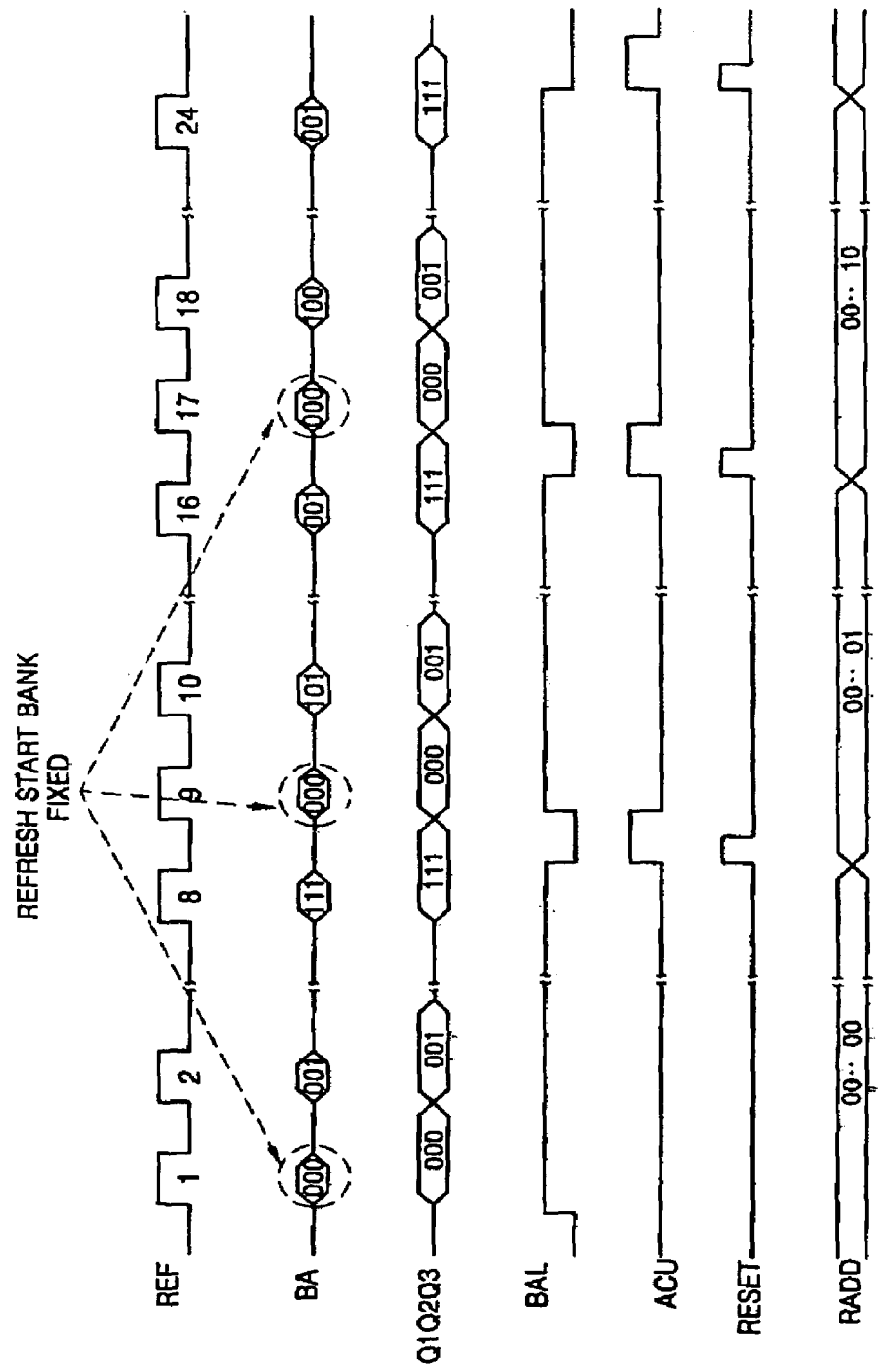
FIG. 10 contains a timing diagram for auto-refresh operation according to an embodiment of the present invention with the start bank address fixed.

FIG. 10 shows a timing diagram for the memory device of FIGS. 5, 8, 9A, and 9B. Three different refresh bank address sequences are commanded for consecutive refresh rows, one sequence for auto-refresh cycles 1–8, a second sequence for auto-refresh cycles 9–16, and a third sequence for auto-refresh cycles 17–24. Each sequence begins, however, with an auto-refresh to bank address 0 (BA 000), causing BAL to be asserted from a refresh start detection/latch circuit 820. BAL remains asserted until eight auto-refresh operations have been completed (at auto-refresh cycles 8, 16, and 24), at which time ACU is asserted, triggering reset circuit 810 to reset refresh start detection/latch circuit 820 and BAL.

In FIG. 9C, refresh start detection circuit 900 can accept any bank address as the start bank address. All eight decoded bank addresses ba0–ba7 are ORed together by three NOR gates 960, 962, and 964 with outputs combined by a NAND gate 970. The ORed bank addresses are combined with REF using a NAND gate 980 and inverter 990 to produce a start signal, in a manner similar to that employed in FIG. 9B for a single bank address.

Figure 11:
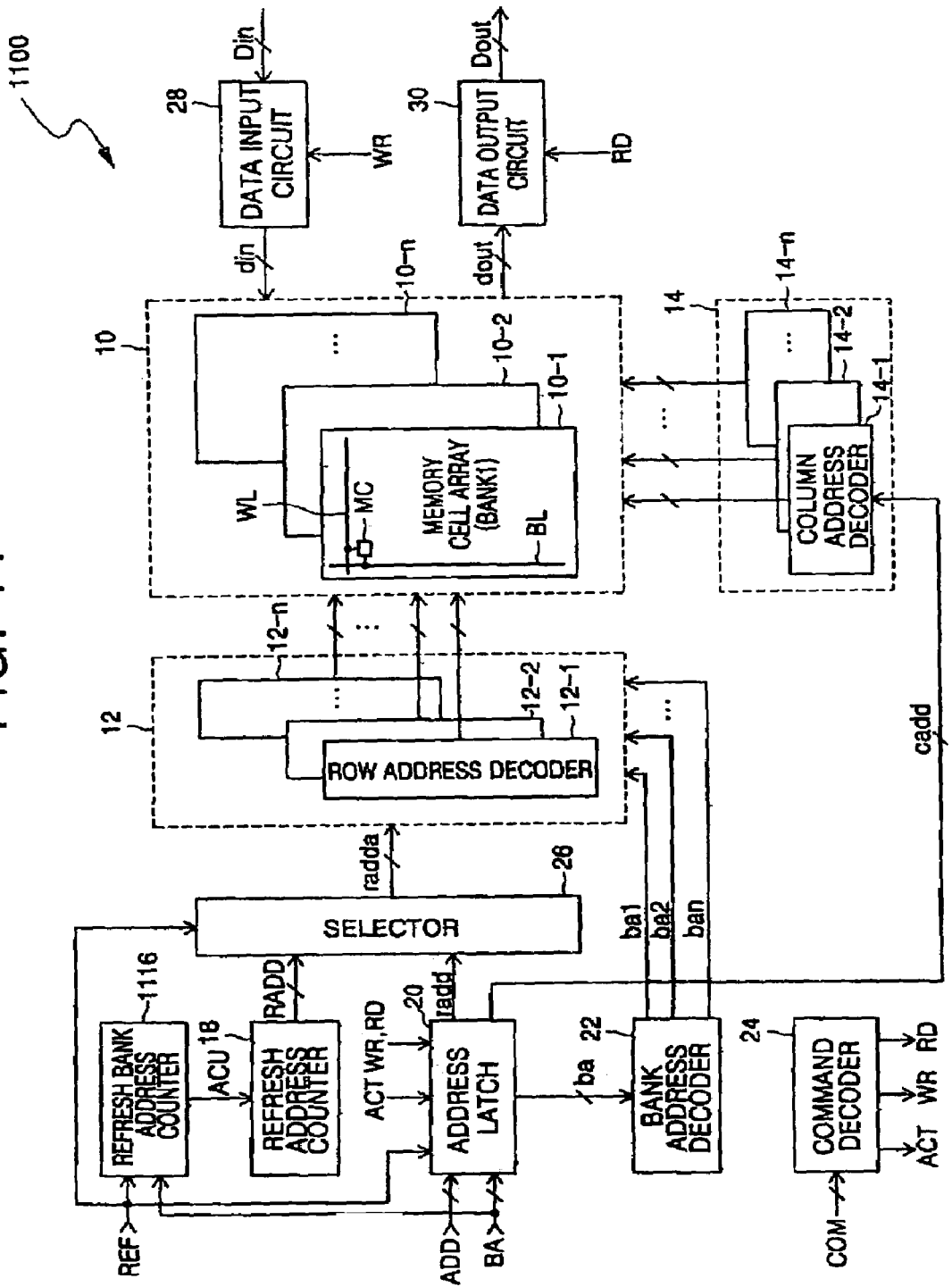
FIG. 11 illustrates yet another SDRAM device according to an embodiment of the present invention.

FIG. 11 illustrates a third embodiment of the present invention, an SDRAM circuit 1100 wherein a refresh bank address detector 1116 is substituted for refresh bank address counter 516 of FIG. 5. Refresh bank address detector 1116 functions by asserting ACU whenever a refresh operation is received for a predetermined final bank address.

Figure 12:
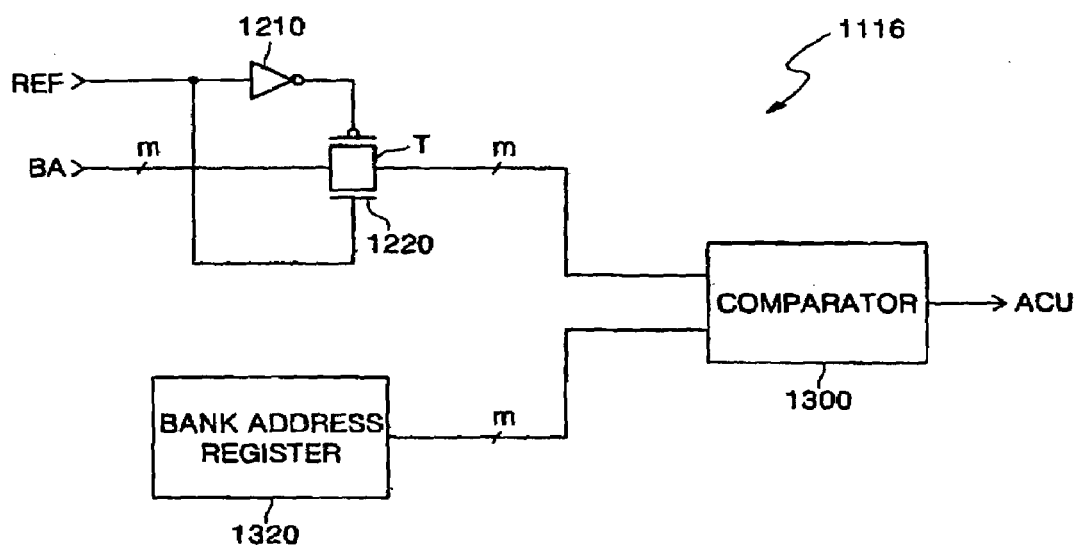
FIGS. 12 and 13 shows circuit alternatives that allow a programmed bank address to be used as a final bank address in embodiments of the present invention.

FIG. 12 illustrates one embodiment of refresh bank address detector 1116. Detector 1116 comprises an inverter 1210, an m-input/m-output transmission gate 1220, a comparator 1300, and a bank address register 1320. The m lines of external bank address BA are supplied to transmission gate 1220. Transmission gate 1220 is controlled by external auto-refresh command signal REF, which directly drives the n-gate of the transmission gate, and drives the p-gate of the transmission gate through inverter 1210.

Bank address register 1320 contains a predetermined final bank address, stored using m bits in the same order as the m BA inputs. When REF activates transmission gate 1220, comparator 1300 compares the m BA inputs to the M bank address register 1320 inputs. Comparator 1300 asserts ACU when the comparison evaluates true.

Bank address register 1320 can be programmed in many different ways. One simple, but inflexible, approach involves designing the chip mask to permanently assert a given final bank address. Several other more flexible approaches will now be described.

Figure 13:
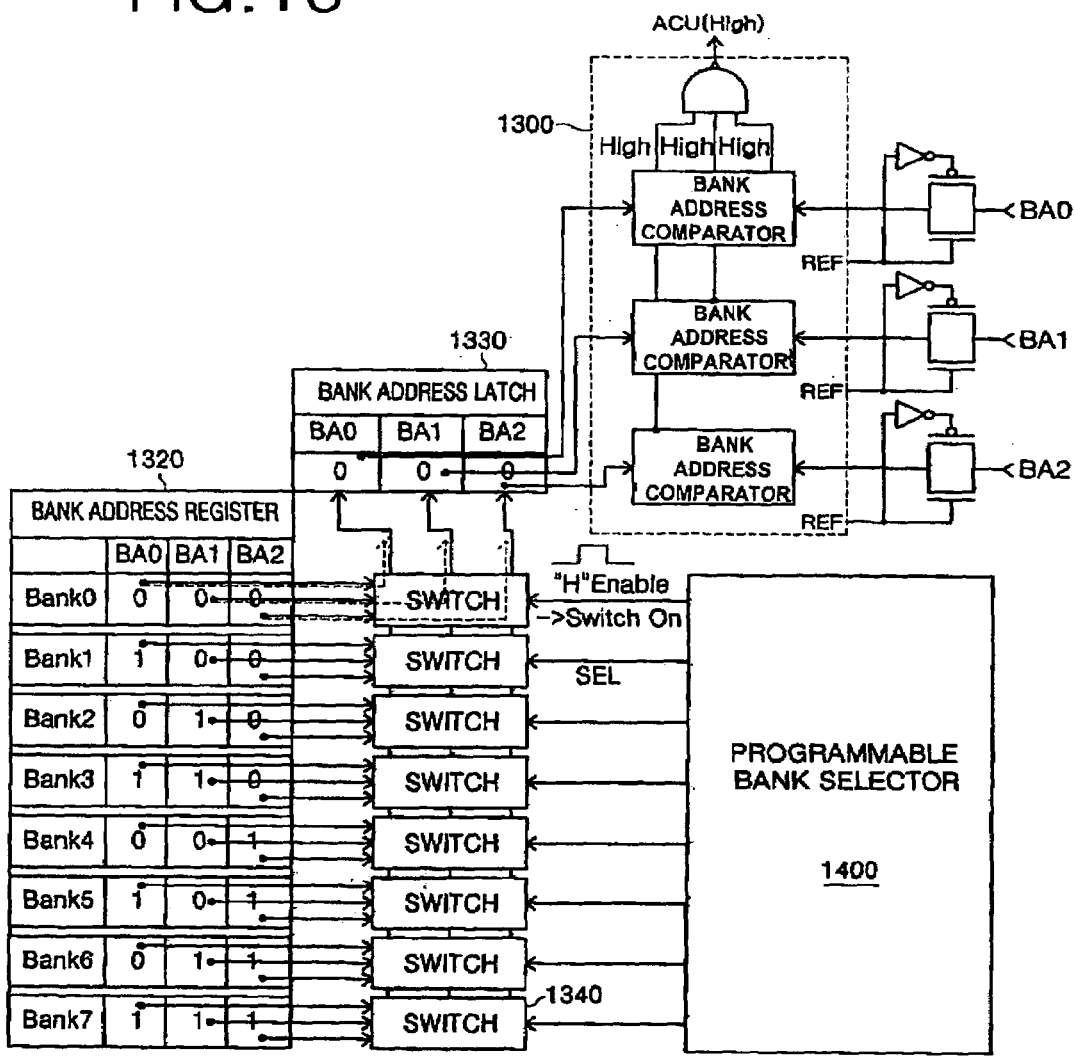

FIG. 13 shows one approach that allows any bank address to be programmed as the final bank address. Bank address register 1320 actually comprises hard-coded binary bank addresses <BA0,BA1,BA2> corresponding to each bank Bank0 to Bank7. A switch crossbar 1340 allows any of the register 1320 bank addresses to be loaded to a bank address latch 1330 in response to one select signal (SEL) among a plurality of select signals (SELs) generated from a programmable bank selector 1400. A programmable bank selector 1400 energizes one of the switches in crossbar 1340 according to a corresponding select signal SEL, which indicates a programmed bank indication.

Comparator 1300 comprises three bank address comparators, one each for BA0, BA1, and BA2. Each comparator performs a binary comparison between one of the bank address lines and a corresponding bit from bank address latch 1330, All three bank address comparators produce a binary match output to an AND circuit, which asserts ACU when all bits match.

Figure 14A:
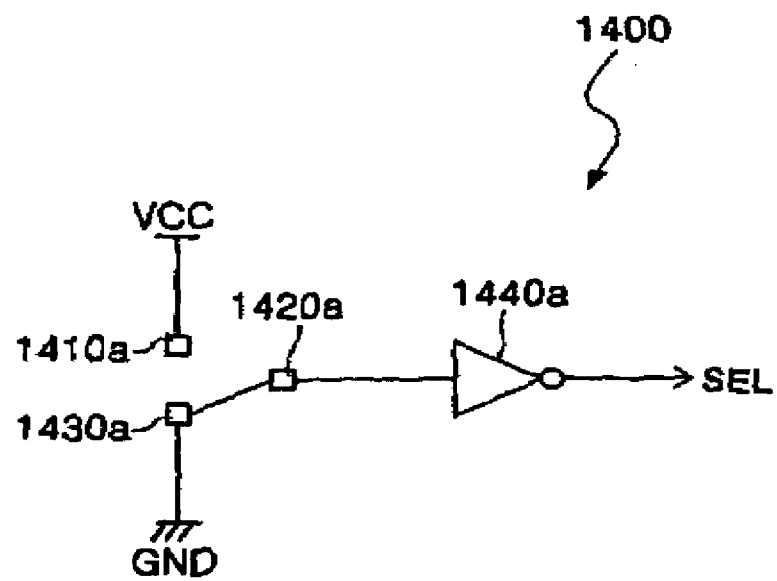
FIG. 14a illustrates a bonding option circuit useful for programming a final bank address.

FIGS. 14a, 14b, 14c, and 14d illustrate four possible methods for setting programmable bank selector 1400. In FIG. 14a, bank selector 1400 comprises one or more circuits comprising a bond pad 1420a and an inverter 1440a. Bond pad 1420a provides a bonding option—when pad 1420a is bonded to a lead frame $V_{CC}$ contact 1410a, inverter 1440a does not assert a selection output SEL for that line. When pad 1420a is bonded to a lead frame ground contact 1430a, inverter 1440a does assert a selection output SEL for that line. Thus a final bank address can be selected during packaging by bonding one selector 1400 bond pad to ground and the rest to $V_{CC}$.

Figure 14B:
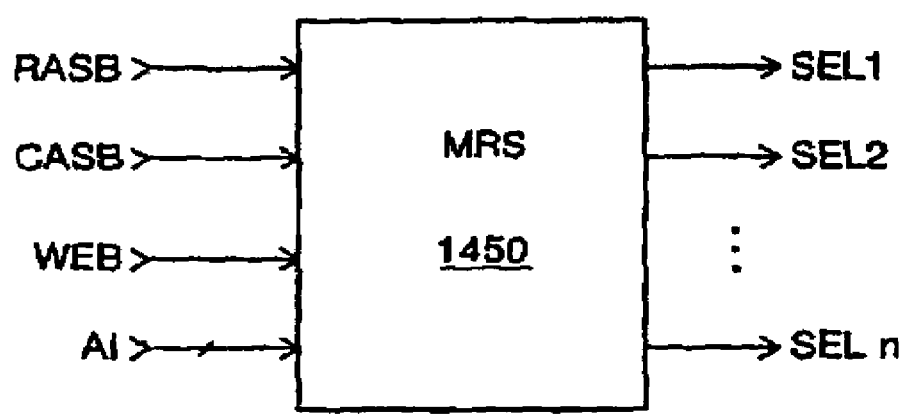
FIG. 14b illustrates a mode register set circuit useful for programming a final bank address.

In FIG. 14b, a Mode Register Set (MRS) 1450 provides n select lines SEL1 to SELn. When a particular combination of inputs RASB, CASB, and WEB trigger MRS 1450, it reads the external address lines Ai and decodes the address as a particular mode register instruction. Different mode register instructions can thus be used to activate different ones of select lines SEL1 to SELn.

Figure 14C:
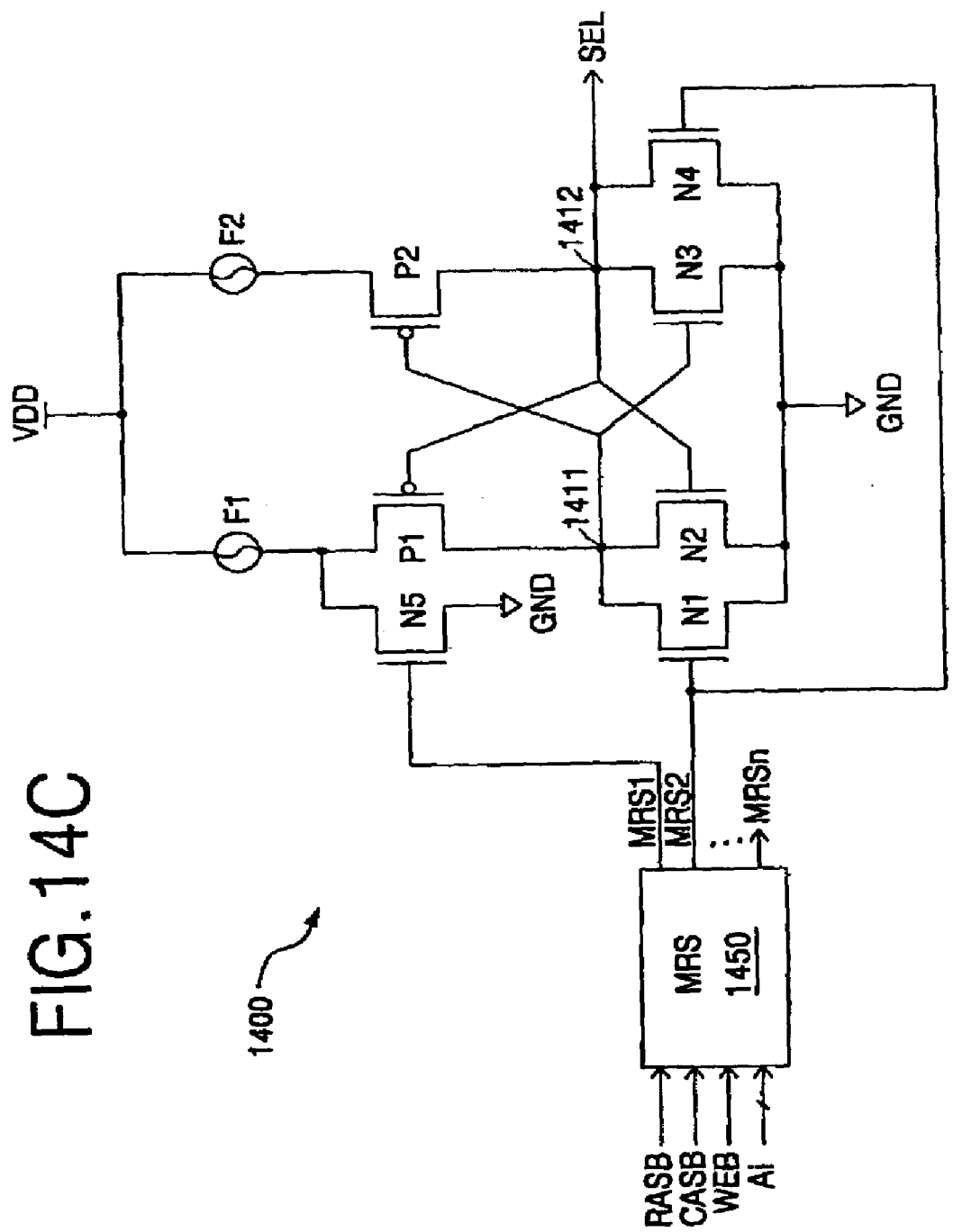
FIG. 14c illustrates an electronically settable fuse circuit useful for programming a final bank address.

A Mode Register Set can also be used to permanently program a final bank address, after the SDRAM device has been assembled. In FIG. 14c, MRS 1450 supplies a plurality of MRS fuse-burning outputs MRS1–MRSn. By asserting a particular combination on the fuse-burning outputs, an electric fuse circuit permanently severs one of two electric fuses F1 and F2 for each select line SEL. Depending on which fuse is severed, each SEL line will be set permanently high or permanently low, even when the device is powered off and on again.

In FIG. 14d, another programmable bank selector circuit 1400 is illustrated. The FIG. 14d embodiment uses a laser-cut fuse F3 that can be cut after the device is fabricated but prior to packaging. Circuit 1400 delays power-on until supply voltages stabilize, by relying on a delayed control voltage VCCH that is not triggered high until the supply voltage rises above a threshold (illustrated in the time vs. voltage plot included with FIG. 14d. Depending on whether fuse F3 is severed or not, SEL will always be asserted or deasserted once the device powers on.

Figure 15:
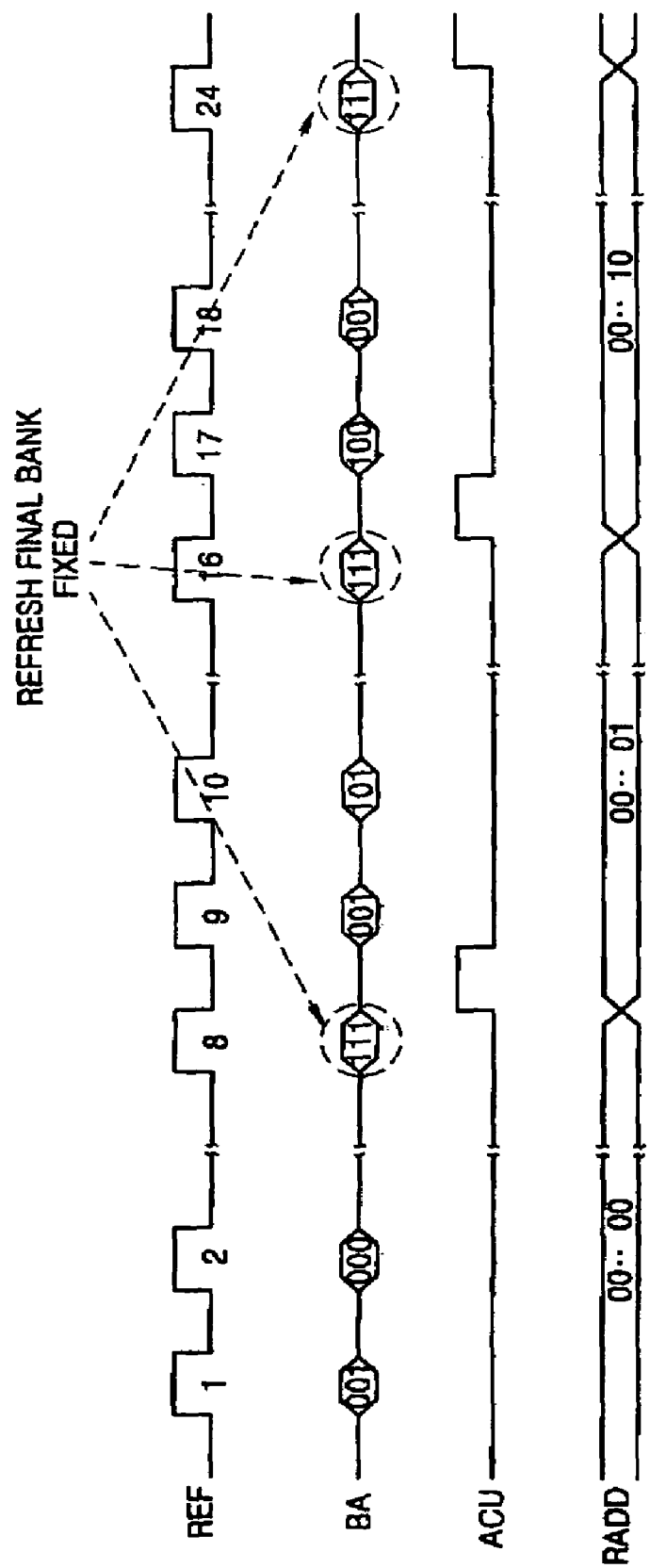
FIG. 15 contains a timing diagram for auto-refresh operation according to an embodiment of the present invention with the final bank address fixed.

FIG. 15 contains a timing diagram example for the embodiments of FIGS. 11–14d. By the chosen means, a final bank address 111 is selected for comparison to the external bank address. The SDRAM 1100 continues to refresh banks in the same row until an auto-refresh command accompanied by the final bank address 111 is received (auto-refresh cycles 8, 16, and 24). When final bank address 111 is received, the refresh command is executed and the refresh row is advanced. It does not matter what order the other bank addresses are presented—in fact, refresh row could be advanced in this circuit without every bank being addressed for a given refresh row.

Figure 16:
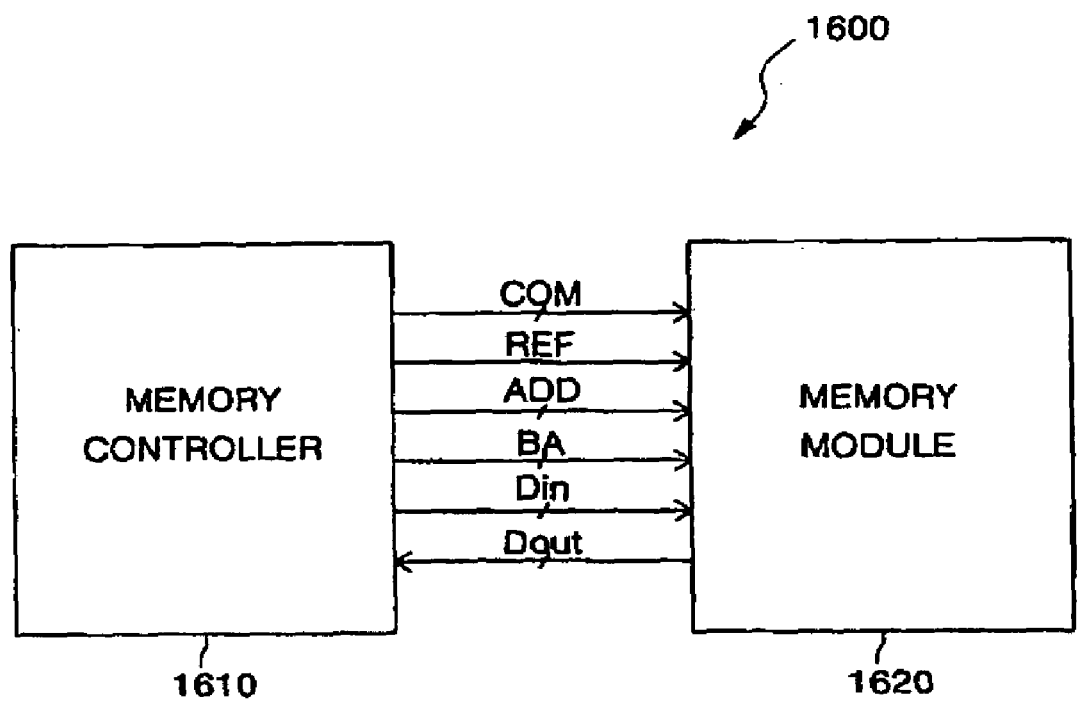
FIG. 16 depicts a memory system according to an embodiment of the present invention.

Each of the above-described SDRAM devices is assumed to be paired with a memory controller capable of supplying allowable refresh bank address sequences. In FIG. 16, one common configuration for coupling the SDRAM and memory controller is illustrated as a memory system 1600. Memory system 1600 comprises a memory controller 1610 and a memory module 1620. Memory module 1610 comprises one or more SDRAM devices according to an embodiment of the present invention, coupled in a single rank or multiple ranks of memory devices. Memory controller 1610 supplies command (COM), auto-refresh (REF), address (ADD), and bank address (BA) signals to the SDRAM devices on memory module 1620. Data is supplied to memory module 1620 on data lines Din, and data is received from memory module 1620 on data lines Dout (lines Din and Dout may be the same lines, with only one of controller 1610 and module 1620 allowed to drive the lines at any given time).

Figure 17:
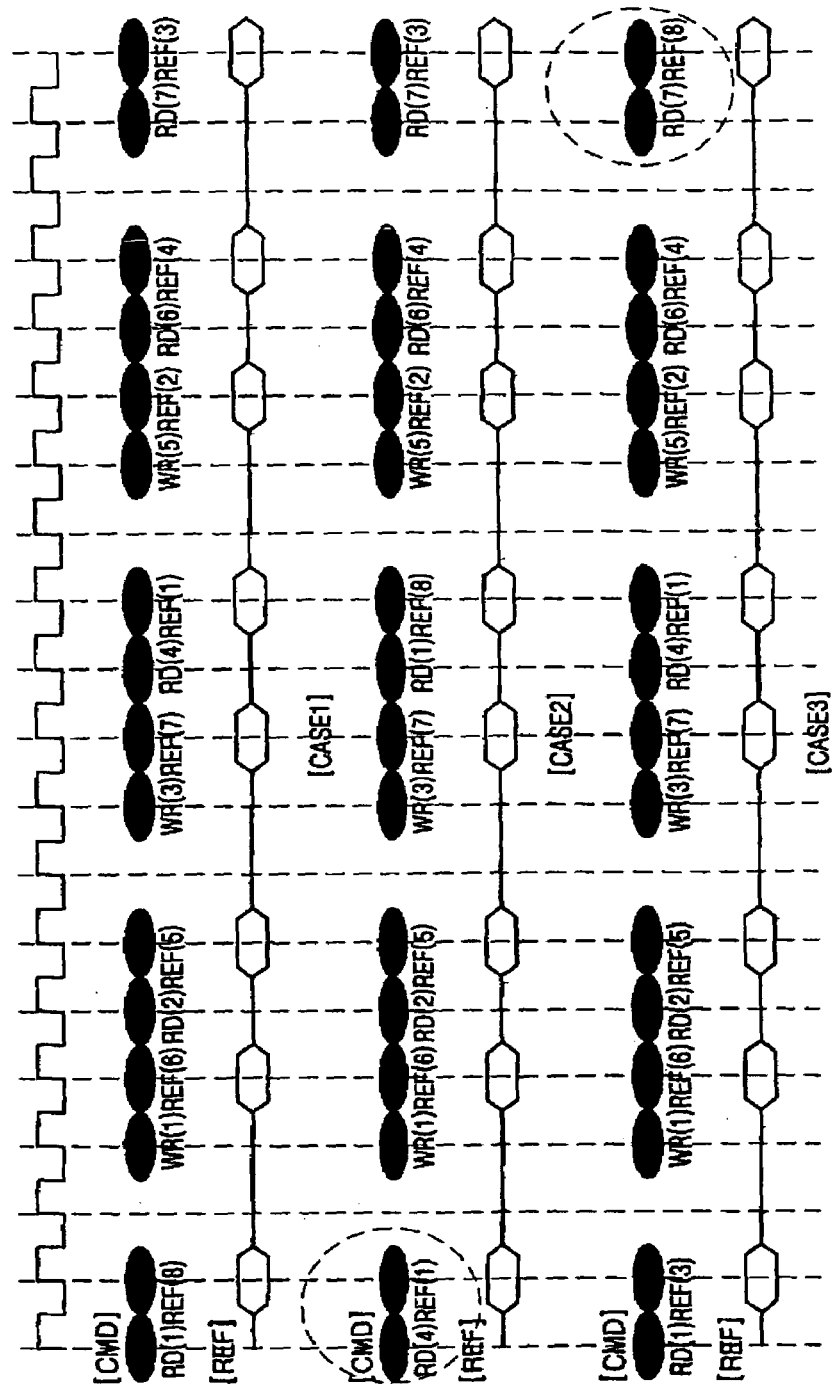
FIG. 17 shows examples of different command sequences that can be accomplished with a memory system according to an embodiment of the present invention.

FIG. 17 illustrates how the memory system of FIG. 16 can be operated according to an embodiment of the present invention, for three different exemplary activity sequences Case 1, Case 2, and Case 3. In each case, a different auto-refresh sequence is used. Memory controller 1610 knows which banks have memory accesses in progress, and which banks will soon have memory accesses requested.

When an auto-refresh command must be issued, the memory controller selects a bank that is not currently being accessed, and will not need to be accessed before the auto-refresh command completes for that bank. This allows auto-refresh operations to be accomplished, if desired, in the least obtrusive manner.

Those skilled in the art will recognize that many other device configuration permutations can be envisioned and many design parameters have not been discussed. For instance, although a separate external auto-refresh signal line REF has been assumed, auto-refresh commands could be decoded from a specific combination asserted on a command bus. Various features of the described embodiments can be combined with other embodiments. The specific circuits described and shown in the drawings are merely exemplary—in most cases, other circuits can accomplish the same or similar functions. Such minor modifications and implementation details are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A synchronous memory device comprising:
    a plurality n of independently addressable memory cell array banks, each having a bank address;
    a refresh address generator to specify a current refresh row to all memory cell array banks;
    bank address circuitry to receive an externally supplied bank address for a refresh operation and apply the refresh operation to the current refresh row of the memory cell array bank corresponding to the bank address; and
    a refresh bank address counter to signal the refresh address generator to generate a new refresh row when refresh operations have been addressed to the current refresh row in each of the plurality of memory cell array banks.

2. The memory device of claim 1, wherein the refresh bank address counter counts refresh cycles, and signals the refresh address generator to generate the new refresh row when the counter reaches an integer multiple of n.

3. The memory device of claim 1, wherein a refresh cycle is initiated by an external refresh command signal.

4. The memory device of claim 1, wherein a refresh cycle is initiated by an internal refresh command signal.

5. The memory device of claim 1, wherein one of the bank addresses is designated as a start bank address, the refresh bank address counter resetting upon receipt of an externally supplied start bank address for a refresh operation.

6. The memory device of claim 5, wherein the externally supplied start bank address is received from a memory controller after a refresh operation is completed with regard to the current refresh row in each of the plurality of memory cell array banks.

7. The memory device of claim 1, wherein one of the bank addresses is designated as a final bank address, the refresh bank address counter signaling the refresh address generator to generate the new refresh row upon receipt of an externally supplied final bank address for a refresh operation.

8. The memory device of claim 1, wherein n is equal to $2^m$, the refresh bank address counter comprising an m-stage counter.

9. The memory device of claim 8, wherein the m-stage counter comprises:
    a first flip-flop receiving the refresh command signal and generating a first output signal to the address counter update signaling circuitry;
    a second flip-flop receiving the first output signal and generating a second output signal to the address counter update signaling circuitry; and
    a third flip-flop receiving the second output signal and generating a third output signal to the address counter update signaling circuitry.

10. The memory device of claim 1, wherein the refresh bank address counter comprises:
    n bank address latches corresponding to the n memory cell array banks, the refresh bank address counter setting a respective bank address latch when a refresh operation is addressed to the corresponding memory cell array bank; and
    address counter update signaling circuitry to signal the refresh address generator and reset the n bank address latches once all n bank address latches have been set.

11. The memory device of claim 10, wherein each of the n bank address latches comprises a transmission gate to receive a corresponding one of n bank select signals, transmission gate enable logic to enable the transmission gate during a refresh operation when the latch is unset, a latch circuit to store the logic value of the bank select signal, and a reset circuit to reset the latch circuit based on a signal received from the address counter update signaling circuitry.

12. The memory device of claim 11, each of the n bank address latches further comprising a logic circuit receiving the refresh command signal and an output signal of the bank address latch and generating a control signal to gate terminals of the transmission gate.

13. The memory device of claim 1, wherein the refresh bank address counter comprises:
    a start detection latch circuit to enable refresh bank address counting when a first externally supplied bank address is received; and
    reset circuitry to disable bank address counting after refresh operations have been addressed to the current refresh row in each of the plurality of memory cell array banks.

14. The memory device of claim 13, wherein the first externally supplied bank address can be any valid bank address.

15. The memory device of claim 14, wherein the start detection latch circuit comprises:
    OR logic to receive n bank selection signals, each bank selection signal indicating that a refresh operation has been addressed to a corresponding one of the n memory cell array banks for the current refresh row; and
    AND logic to AND the output of the OR logic with a refresh operation signal during a refresh operation.

16. The memory device of claim 13, wherein the first externally supplied bank address is a predetermined bank address and the start detection latch circuit comprises a logic circuit to receive the predetermined bank address and the refresh command signal.

17. The memory device of claim 13, wherein the start detection latch circuit comprises:
    AND logic to generate a start pulse during a refresh operation when a predetermined bank address is supplied as the bank address for the refresh operation;

a start latch to latch the output of the AND logic;
a switch circuit to disconnect the output of the AND logic from the start latch once a start pulse has been latched into the start latch; and
reset logic to reset the start latch based on the output of the reset circuitry.

18. A synchronous memory device comprising:
a plurality n of independently addressable memory cell array banks, each having a bank address;
a refresh address generator to specify a current refresh row to all memory cell array banks;
bank address circuitry to receive an externally supplied bank address for a refresh operation and apply the refresh operation to the current refresh row of the memory cell array bank corresponding to the bank address; and
a refresh bank address detector to signal the refresh address generator to generate a new refresh row when refresh operations have been addressed to the current refresh row in each of the plurality of memory cell array banks, the refresh bank address detector receiving a refresh command signal and a current bank address.

19. The memory device of claim 18, wherein the refresh bank address detector comprises:
a register to store a predetermined final bank address; and
a comparator to compare the current bank address to the final bank address and signal the refresh address generator when the current bank address matches the final bank address.

20. The memory device of claim 19, wherein the register contains a fixed predetermined final bank address.

21. The memory device of claim 19, wherein the register comprises:
a bank address selection register containing fixed bank addresses;
a programmable selector to select one of the fixed bank addresses from the bank address selection register; and
a latch to hold the selected fixed bank address as the predetermined final bank address.

22. The memory device of claim 19, further comprising a mode register set, wherein the final bank address is programmable through the mode register set.

23. The memory device of claim 19, wherein the final bank address is programmable through fuse circuitry.

24. The memory device of claim 19, wherein the final bank address is programmable through mask options.

25. The memory device of claim 19, wherein the final bank address is programmable through bonding options.

26. The memory device of claim 18, further comprising an external refresh signal input, wherein a refresh operation is initiated by externally asserting the refresh signal.

27. The memory device of claim 18, further comprising a command decoder to receive external commands, the command decoder capable of generating an internal refresh signal in response to a plurality of commands received by the command decoder.

28. A memory system comprising:
at least one memory unit having n memory banks and a bank-addressable auto-refresh operation, the memory unit comprising auto-refresh circuitry that performs an auto-refresh operation on a refresh row in each bank as that bank is addressed in an auto-refresh operation, until all n banks have been addressed in at least one auto-refresh operation corresponding to the refresh row; and
a controller to assert active commands and supply external refresh bank address signals to the memory unit, the controller having a normal auto-refresh mode that supplies all n bank address signals in n successive auto-refresh operations, and supplies all n bank address signals in the following n successive auto-refresh operations.

29. The memory system of claim 28, wherein the controller has the capability to modify the sequence of the n bank address signals supplied in n successive auto-refresh operations to reduce conflicts with active commands executing concurrently on the memory unit.

30. The memory system of claim 28, wherein the memory unit is a memory module and the controller is a memory controller under the control of an external processor.

31. The memory system of claim 28, wherein the controller asserts an external refresh command signal to the memory unit to initiate an auto-refresh operation on the memory unit.

32. The memory system of claim 28, wherein the memory unit generates an internal refresh command signal to initiate an auto-refresh operation on the memory unit.

33. The memory system of claim 28, wherein the memory unit is an integrated circuit.

34. The memory system of claim 28, wherein the memory controller is integrated on a processor.

35. A method of operating a synchronous memory device having a plurality of memory cell array banks, the method comprising:
receiving an external refresh bank address;
performing an auto-refresh operation on a current row of a memory cell array bank corresponding to the external refresh bank address; and
updating the current row to a new row when auto-refresh operations have been performed on the current row of each memory cell array bank.

36. The method of claim 35, wherein updating the current row to a new row when auto-refresh operations have been performed on the current row of each memory cell array bank comprises:
counting the number of auto-refresh operations performed; and
when the number of auto-refresh operations performed equals the number of memory cell array banks, updating the current row to the new row and resetting the count.

37. The method of claim 35, wherein updating the current row to a new row when auto-refresh operations have been performed on the current row of each memory cell array bank comprises:
tracking which of the memory cell array banks have had an auto-refresh operation performed on the current row; and
when each memory cell array bank has had an auto-refresh operation performed on the current row, updating the current row and restarting the tracking.

38. The method of claim 35, wherein updating the current row to a new row when auto-refresh operations have been performed on the current row of each memory cell array bank comprises:
updating the current row to the new row when a predetermined final bank address is received with an auto-refresh operation.

39. The method of claim 38, wherein the predetermined final bank address is programmable.

40. The method of claim 35, wherein updating the current row to a new row when auto-refresh operations have been performed on the current row of each memory cell array bank comprises:

starting auto-refresh operations on the new row when a predetermined start bank address is received with an auto-refresh operation.

41. A synchronous memory device comprising:
a plurality of independently addressable memory cell array banks;
a refresh address generator to specify a current refresh row common to all memory cell array banks;
means for externally addressing a refresh operation to less than all of the plurality of memory cell array banks; and
means for signaling the refresh address generator to generate a new refresh row when refresh operations have been addressed to the current refresh row in each of the plurality of memory cell array banks.

42. A synchronous memory device comprising:
a plurality n of independently addressable memory cell array banks, each having a bank address;
a refresh address generator to specify a current refresh row to all memory cell array banks;
bank address circuitry to receive an externally supplied bank address for a refresh operation and apply the refresh operation to the memory cell array bank corresponding to the bank address; and
a refresh bank address counter to signal the refresh address generator to generate a new refresh row when refresh operations have been addressed to the current refresh row in each of the plurality of memory cell array banks, the refresh bank address counter comprising a refresh start detection/latch circuit that, after the new refresh row is generated, enables the refresh bank address counter to begin counting refresh operations for the new refresh row when a predetermined start bank address is received as the bank address for a refresh operation.

43. A synchronous memory device comprising:
a plurality n of independently addressable memory cell array banks, each having a bank address;
a refresh address generator to specify a current refresh row to all memory cell array banks;
bank address circuitry to receive an externally supplied bank address for a refresh operation and apply the refresh operation to the memory cell array bank corresponding to the bank address; and
a refresh bank address counter to signal the refresh address generator to generate a new refresh row when refresh operations have been addressed to the current refresh row in each of the plurality of memory cell array banks, the refresh bank address counter comprising circuitry to compare the bank address for a refresh operation to a predetermined final bank address, and generate the signal when the bank address for a refresh operation equals the predetermined final bank address.

* * * * *